(12) United States Patent
Luo et al.

(10) Patent No.: US 8,722,524 B2
(45) Date of Patent: May 13, 2014

(54) METHOD FOR FORMING A SEMICONDUCTOR DEVICE INCLUDING REPLACING MATERIAL OF DUMMY GATE STACKS WITH OTHER CONDUCTIVE MATERIAL

(75) Inventors: Zhijiong Luo, Poughkeepsie, NY (US); Haizhou Yin, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 166 days.

(21) Appl. No.: 13/380,362

(22) PCT Filed: Feb. 27, 2011

(86) PCT No.: PCT/US2011/071348
§ 371 (c)(1),
(2), (4) Date: Dec. 22, 2011

(65) Prior Publication Data
US 2012/0181623 A1    Jul. 19, 2012

(30) Foreign Application Priority Data
Nov. 18, 2010   (CN) .......................... 2010 1 0548655

(51) Int. Cl.
*H01L 21/8234*    (2006.01)
(52) U.S. Cl.
USPC ..... 438/586; 438/183; 438/300; 257/E21.444
(58) Field of Classification Search
USPC ........... 438/296, 300, 586, 183; 257/E21.444
See application file for complete search history.

(56) References Cited

U.S. PATENT DOCUMENTS

| | | | |
|---|---|---|---|
| 5,950,090 A * | 9/1999 | Chen et al. | 438/296 |
| 6,163,047 A | 12/2000 | Sung et al. | |
| 6,835,970 B2 * | 12/2004 | Nam et al. | 257/202 |
| 2004/0115890 A1 | 6/2004 | Saito | |
| 2004/0175909 A1 | 9/2004 | Matsumoto | |

FOREIGN PATENT DOCUMENTS

CN   101345240 A   1/2009

OTHER PUBLICATIONS

Written Opinion from PCT/CN2011/071348 dated Aug. 4, 2011 (4 pages).
English translation of International Search Report for International Application No. PCT/CN2011/071348 mailed Aug. 4, 2011 (4 pages).
Patent Abstract for Chinese Publication No. 101345240 Published Jan. 14, 2009 (1 page).

* cited by examiner

*Primary Examiner* — Anh Mai
(74) *Attorney, Agent, or Firm* — Osha Liang LLP

(57) ABSTRACT

It is provided a method for forming a semiconductor device comprising: forming a material layer which exposes dummy gates and sidewall spacers and fills spaces between two adjacent gate stacks, and the material of the material layer is the same as the material of the dummy gate; removing the dummy gates and the material layer to form recesses; filling the recesses with a conductive material, and planarizing the conductive material to expose the sidewall spacers; breaking the conductive material outside the sidewall spacers to form at least two conductors, each of the conductors being only in contact with the active region at one side outside one of the sidewall spacers, so as to form gate stack structures and first contacts. Besides, a semiconductor device is provided. The method and the semiconductor device are favorable for extending process windows in forming contacts.

12 Claims, 7 Drawing Sheets

METHOD FOR FORMING A SEMICONDUCTOR DEVICE INCLUDING REPLACING MATERIAL OF DUMMY GATE STACKS WITH OTHER CONDUCTIVE MATERIAL

CROSS REFERENCE TO RELATED APPLICATION

This application is a National Phase application of PCT Application No. PCT/CN2011/071348, filed on Feb. 27, 2011, entitled "Semiconductor Device and Method for Forming the Same," which claims priority to Chinese Application No. 201010548655.4, filed on Nov. 18, 2010. Both the PCT Application and Chinese Application are incorporated herein by reference in their entireties.

FIELD OF INVENTION

The present invention generally relates to the field of semiconductor technology, and specifically, relates to a semiconductor device and a method for forming the same.

BACKGROUND OF THE INVENTION

A conventional method for forming a semiconductor device in the prior art comprises the following steps: forming a gate 14 and sidewall spacers 16 on a semiconductor substrate 10 (as shown in FIG. 1); the gate 14 is formed on the semiconductor substrate 10 with a gate dielectric layer 12 therebetween, and the sidewall spacers 16 cover the opposite side surfaces of the gate 14; then forming source/drain regions 20 and contact regions 18 (e.g. a metal silicide layer); forming a planarized dielectric layer 22 which covers the gate 14 and sidewall spacers 16 (as shown FIG. 2); and then, etching the dielectric layer 22 with a mask, so as to form contacts.

In the above method, the step for forming the contacts comprises: first, forming contact vias 30 in the dielectric layer 22 (as shown in FIG. 3), wherein the contact vias 30 expose a portion of the contact regions 18; next, forming a contact layer 32 which covers the bottom and sidewalls of contact vias 30 (as shown in FIG. 4); then, forming a conductive layer 34 which is formed on the contact layer 32 and fills the contact vias 30 (as shown in FIG. 5). As shown in FIG. 6, after the conductive layer 34 and the contact layer 32 are planarized to expose the dielectric layer 22, subsequent operations will be continually performed.

However, as pitches between semiconductor devices are being scaled down, process windows in the formation of contacts also become progressively smaller. Accordingly, there is a need to propose a new process for fabricating semiconductor devices, in order to extend the process windows.

SUMMARY OF THE INVENTION

In order to solve aforesaid problem, it is provided a semiconductor device and a method for forming the same, which are favorable for extending process windows in forming contacts.

According to an embodiment of the present invention, it is provided a method for forming a semiconductor device, which comprises the following steps.

First, at least two gate stacks and respective sidewall spacers are formed on a semiconductor substrate, wherein the all of the gate stacks are formed on an active region and an isolation region, and each of the gate stacks comprises a gate dielectric layer and a dummy gate. The dummy gates are formed on the semiconductor substrate with the gate dielectric layer therebetween, wherein the sidewall spacers surround both of the respective dummy gate and the respective gate dielectric layer or the sidewall spacers are formed on the respective gate dielectric layer and surround the respective dummy gate.

Then, a material layer is formed, which exposes the dummy gates and the sidewall spacers and is sandwiched between the respective gate stacks, wherein the material of the material layer is the same as the material of the dummy gates.

Next, the dummy gates and the material layer are removed to form recesses.

The recesses are filled with a conductive material, and then the conductive material is planarized to expose the sidewall spacers.

And then, the conductive material outside the sidewall spacers is broken to form at least two conductors, each of which is only in contact with the active region at one side outside the sidewall spacers, and to form gate stack structures and first contacts.

According to another embodiment of the present invention, it is provided a semiconductor device which comprises first contacts and at least two gate stack structures. The gate stack structures are formed on an active region and an isolation region, and each of the gate stack structures comprises a metal gate. The first contacts are sandwiched between the respective gate stack structures, and is made of a material which is the same as the material of the metal gate.

According to another embodiment of the present invention, it is provided a method for forming a semiconductor device, which comprises the following steps.

First, at least two gate stacks are formed on a semiconductor substrate, wherein the gate stacks are formed on an active region and an isolation region. Each of the gate stacks comprises a gate dielectric layer and a dummy gate, wherein the dummy gate is formed on the semiconductor substrate with the gate dielectric layer therebetween.

Then, a mask layer is formed, which surrounds the gate stacks and exposes at least a portion of the active region to form contact regions.

Next, a material layer is formed, which fills the contact regions and exposes the dummy gates and the mask layer, wherein the material of the material layer is the same as the material of the dummy gate.

Then, the dummy gates and the material layer are removed to form recesses.

And then, the recesses are filled with a conductive material, and the conductive material is planarized to expose the mask layer and to form gate stack structures and first contacts.

As compared to the prior art, the technical solutions according to embodiments of the present invention have the following advantages.

In a replacement gate process, since a material layer is made with a material same as that of a dummy gate, the material layer may be removed at the meantime of removing the dummy gate so as to form recesses. Next, the recesses are filled with a conductive material which then is planarized so as to expose the sidewall spacers and form gate stack structures and first contacts. All these are favorable for making use of a limited pitch and filling the space occupied by the pitch completely with the conductive material to form contacts, namely, the contacts can be formed in a self-aligned manner, which is favorable for extending the process window in forming contacts. Additionally, the steps of removing the dummy gates and the material layer at the same time is favorable for simplifying the process and reducing the damages to the semiconductor substrate arising from the removing process.

DETAILED DESCRIPTION OF THE INVENTION

The following disclosure provides a plurality of different embodiments or examples to achieve the technical solutions proposed by the present invention. Description of the components and arrangements of specific examples is given. Of course, they are only illustrative and not limiting the present invention.

Moreover, in the present invention, reference number(s) and/or letter(s) may be repeated in different embodiments. Such repetition is for the purposes of simplification and clearness, and does not denote the relationship between respective embodiments and/or arrangements being discussed.

The following disclosure provides various examples for specific processes and materials. However, it is obvious for a person of ordinary skill in the art that other process and/or materials may alternatively be utilized, without departing from the protection scope of the present invention. However, it is necessary to emphasize that the boundaries of the various regions mentioned herein shall include any essential extensions as needed in the process flow.

Figure 1:
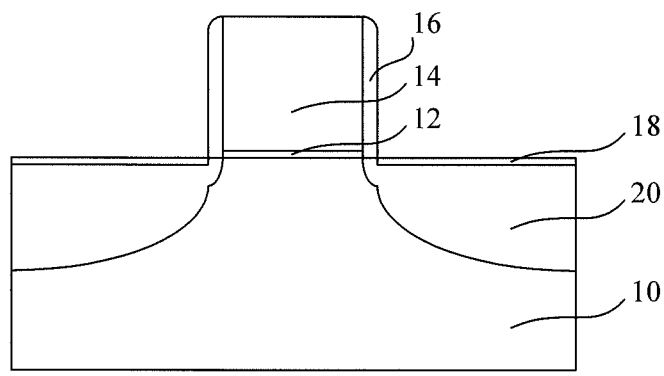
FIGS. 1 to 6 illustrate cross-sectional views of respective intermediate structures at formation of a semiconductor device according to the prior art.
Figure 2:
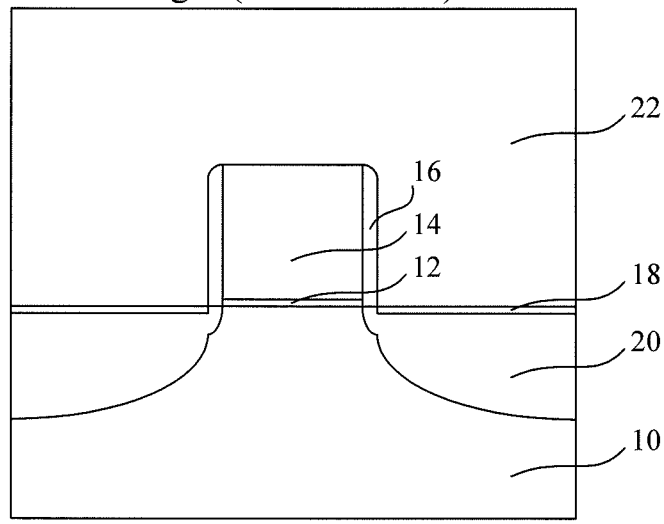
Figure 3:
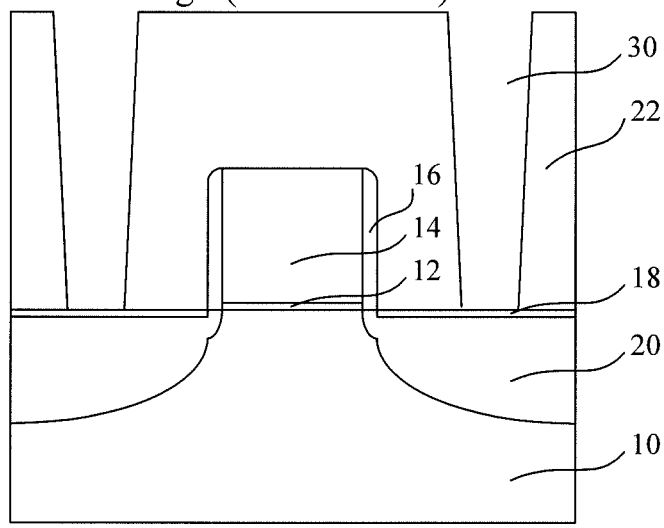
Figure 4:
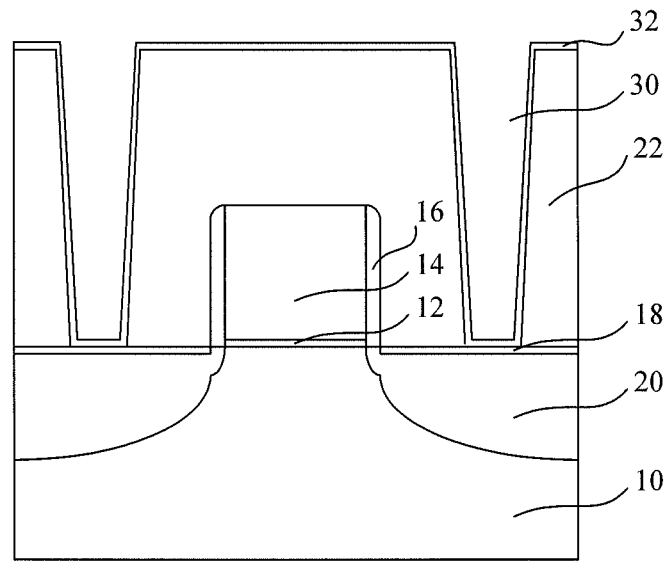
Figure 5:
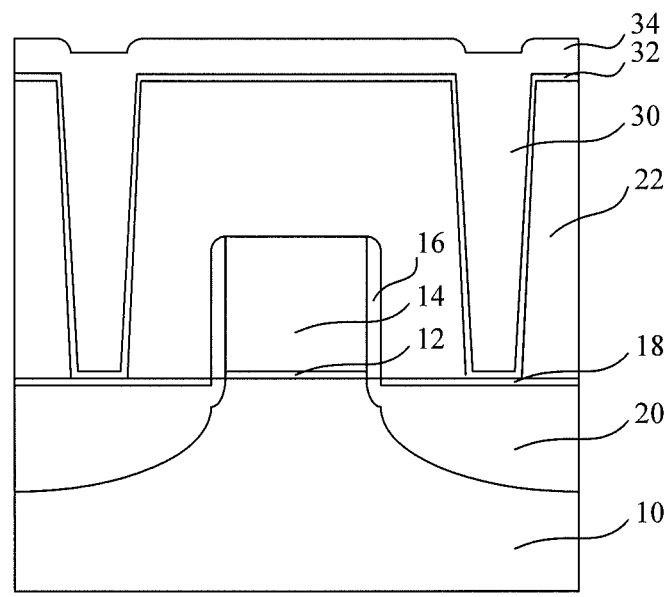
Figure 6:
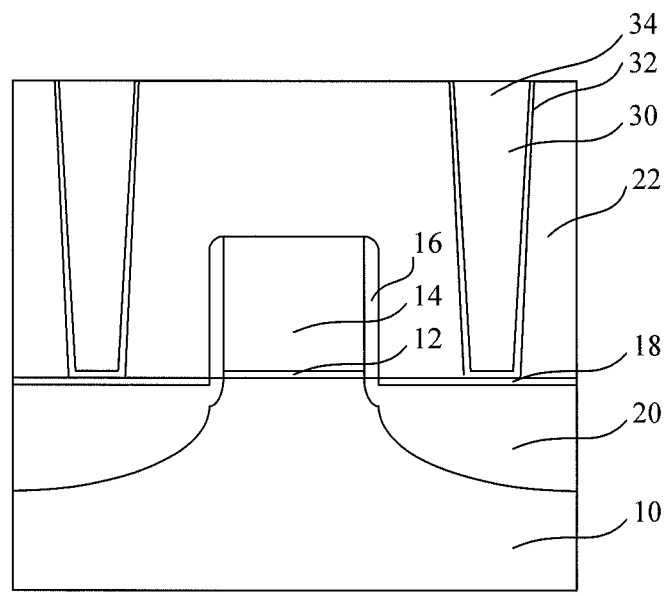
Figure 7:
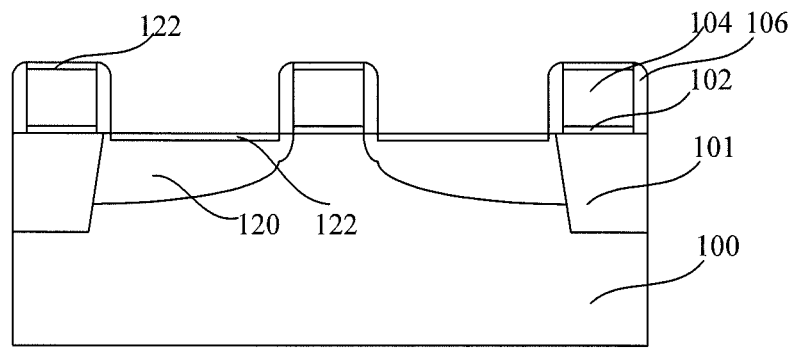
FIGS. 7 to 13 illustrate cross-sectional views of respective intermediate structures obtained during a method for forming a semiconductor device according to an embodiment of the present invention.

According to an embodiment of the present invention, it is provided a method for forming a semiconductor device, comprising the following steps: first, as shown in FIG. 7, forming at least two gate stacks with sidewall spacers 106 on a semiconductor substrate 100, wherein the gate stacks are formed on active regions or on isolation regions 101 (wherein the active regions are isolated by respective isolation regions 101), each of the gate stacks comprises a gate dielectric layer 102 and a dummy gate 104; wherein the dummy gate 106 is formed on the semiconductor substrate 100 with the gate dielectric layer 102 therebetween, the sidewall spacers 106 surround their respective dummy gates 104 and gate dielectric layers 102 (which is favorable for reducing parasitic capacitance in the present embodiment), or the sidewall spacers 106 are formed on the gate dielectric layer 102 and surround their respective dummy gates 104 (in other embodiments).

In the present embodiment, the semiconductor substrate 100 may be a silicon substrate. Preferably, the semiconductor substrate 100 is a silicon epitaxial layer. The semiconductor substrate 100 also may be a silicon on insulator (SOI) substrate. The gate dielectric layer 102 may comprise a Hf-based material, for example, a material selected from a group consisting of HfO2, HfSiO, HfSiON, HfTaO, HfTiO, and HfZrO, or combinations thereof. Alternatively, The gate dielectric layer 102 may comprise a material selected from a group consisting of Al2O3, La2O3, ZrO2, and LaAlO, or combinations thereof or its combination with a Hf-based material. The sidewall spacers 106 may comprise a material selected from a group consisting of Si3N4, SiO2, Si2N2O and SiC, or combinations thereof. The sidewall spacers 106 may be a multi-layer structure. The dummy gate 104 may comprise doped or undoped polysilicon or amorphous silicon (the dopant may be B, P or As, etc.), and preferably doped or undoped polysilicon, which is favorable for precisely controlling the size of the dummy gate 104 so as to further precisely control the size of the final gate to be formed. In other embodiments, the dummy gate 104 also may be made of other insulating material than the material of the sidewall spacers 106, other semiconductor material than the material of the semiconductor substrate 100, or a conductive material.

It is necessary to form source/drain regions 120 before the formation of a subsequent material layer. In the present embodiment, the source/drain regions 120 may be formed after the silicon substrate is doped with doping ions (e.g. B, P or As ions). The source/drain regions 120 may be of an N-type or P-type doping configuration. And a contact layer 122 (e.g. a metal silicide layer) is formed on the surface of the source/drain regions 120.

Besides, in other embodiments, the steps for forming the source/drain regions 120 may also comprise: first, forming trenches on the semiconductor substrate 100 with the gate stacks serving as a mask, so as to expose the material of the semiconductor substrate 100, and next, growing a semiconductor material with the exposed portion of the semiconductor substrate 100 serving as seed crystal, so as to fill the trenches.

As for a PMOS device, the semiconductor material grown may be $Si_{1-x}Ge_x$, wherein the value of x is in the range of 0.1~0.7, for example, 0.2, 0.3, 0.4, 0.5 or 0.6. As for an NMOS device, the semiconductor material grown may be Si:C, wherein the percentage of C atoms is in a range of 0.2%~2%, for example, 0.5%, 1% or 1.5%. The semiconductor material may be grown by adding a reactant including dopant components into a reactant for generating silicon. Next, a metal silicide layer is formed on the exposed source/drain regions 120 (the metal silicide layer also is formed on the dummy gate 104), which is favorable for reducing contact resistance between the first contacts to be formed subsequently and the semiconductor substrate 100. In other embodiments, the metal silicide layer also may be formed after the removal of the dummy gate 104 and the material layer and before the filling of the conductive material.

Figure 8:
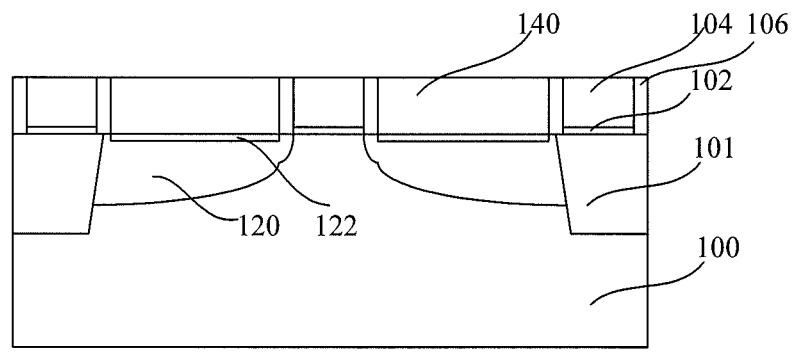

Next, as shown in FIG. 8, a material layer 140 is formed, wherein the material layer 140 fills the gaps between the gate stacks while exposing the top surfaces of the dummy gates 104 and the sidewall spacers 106.

Specifically, a material layer 140 is formed first, which covers the gate stacks and fills the space between the gate stacks, and next, the material layer 140 is planarized to expose the top surfaces of the dummy gates 104 and the sidewall spacers 106.

The material of the material layer 140 may be the same as the material of the dummy gates 104, thus the material layer 140 may be removed when removing the dummy gate 104 subsequently, which is favorable for simplifying the process and reducing damages to the semiconductor substrate arising from the removal operation. The planarization operation may be performed by means of Chemical Mechanical Polish (CMP).

Figure 9:
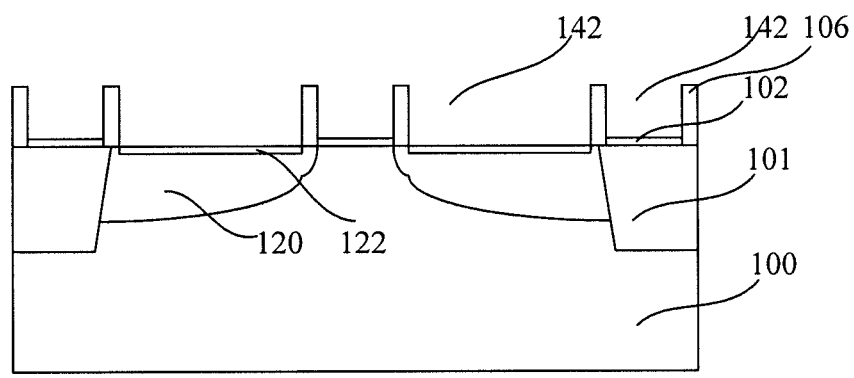

Then, as shown in FIG. 9, the dummy gates 104 and material layer 140 are removed so as to form recesses 142.

The removal operation may be performed by means of anisotropic etching processes such as Reactive Ion Etching (RIE).

Figure 10:
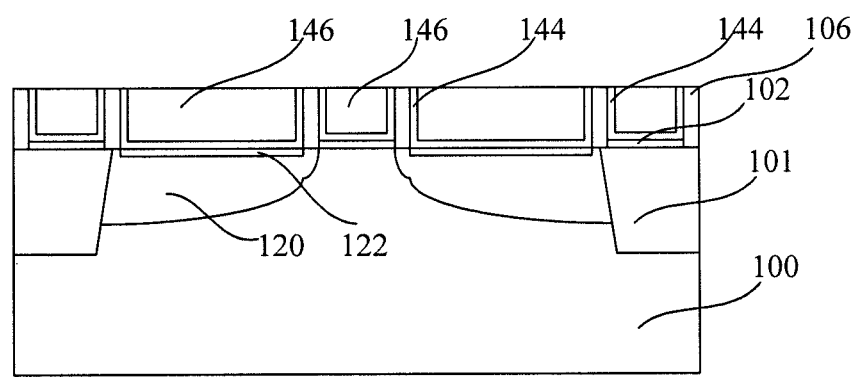

Then, as shown in FIG. 10, after the recesses 142 are filled with a conductive material, the conductive material is planarized to expose the top surfaces of the sidewall spacers, by which the conductive material outside the sidewall spacers is separated so as to form at least two conductors, each of which is only in contact with an active region at one side outside the sidewall spacers, such that gate stack structures and first contacts are formed.

In an embodiment, the step for filling the recesses comprises: first, forming a first contact layer 144 which covers the bottoms and the sidewalls of the recesses 142, and next, forming a first conductive layer 146 which covers the contact layer 144 and fills the recesses 142.

The first contact layer 144 may comprise a material selected from a group consisting of TiN and TiAlN, or combinations thereof. Meanwhile, the first conductive layer 146 may comprise a material selected from a group consisting of W, Al, and TiAl, or combinations thereof or may comprise a combination of Cu with W, Al or TiAl. Herein, "a combination of Cu with W, Al or TiAl" is intended to mean that the bottoms and sidewalls of the recesses 142 are covered with a W, Al or TiAl layer first, and a Cu layer is then formed on the W, Al or TiAl layer, in order to reduce Cu diffusion towards the semiconductor substrate 100.

Figure 11:
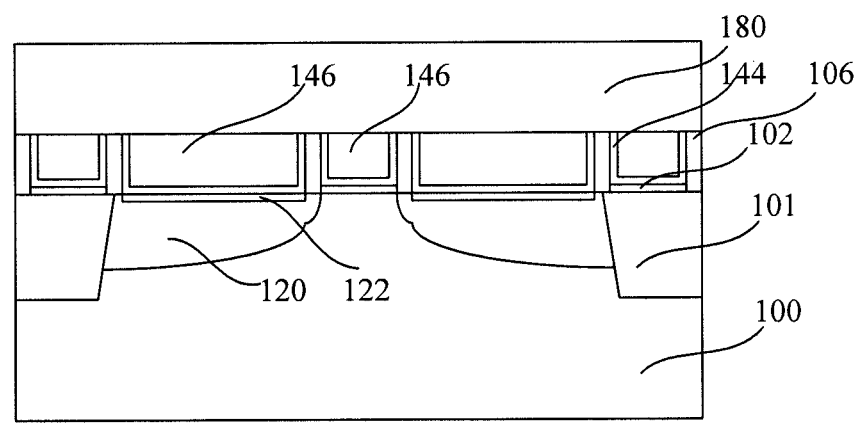
Figure 12:
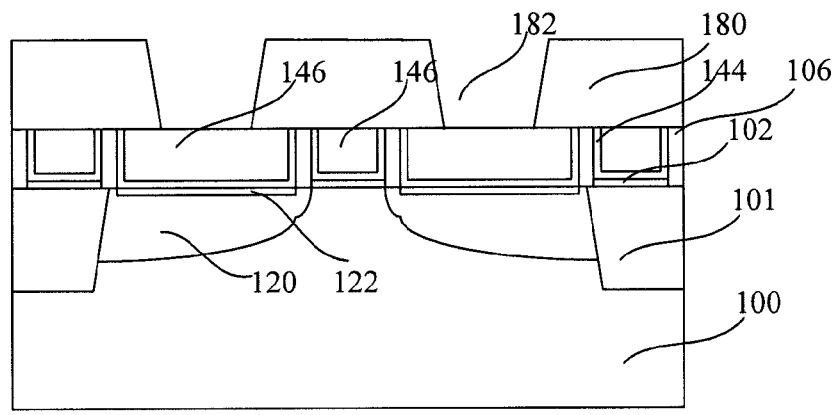
Figure 13:
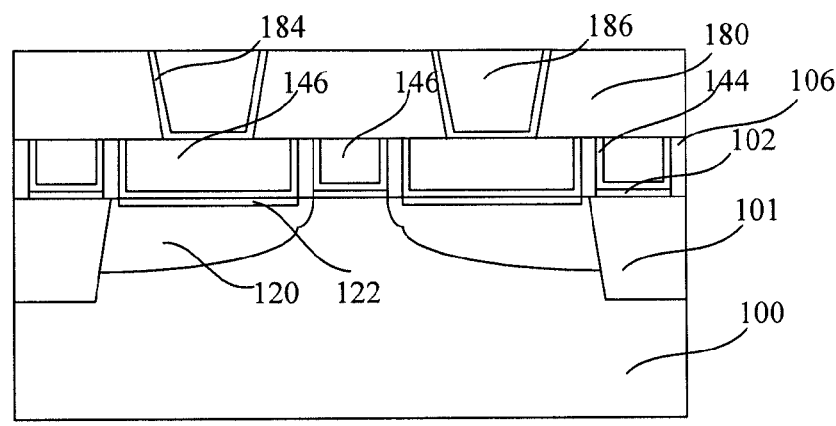

And then, second contacts, which are respectively in contact with the first contacts are formed. The step for forming the second contacts may comprises: first, as shown in FIG. 11, forming a planarized dielectric layer 180 which covers the gate stack structures and the first contacts; next, as shown in FIG. 12, forming contact vias 182 in the planarized dielectric layer 180, wherein the contact vias 182 expose partially the first contacts; next, forming sequentially a second contact layer 184 and a second conductive layer 186, wherein the second contact layer 184 covers the bottoms and sidewalls of the contact vias 182, and the second conductive layer 186 covers the second contact layer and fills the contact vias 182. As shown in FIG. 13, follow-up operations may be performed after planarization of the second contact layer 184 and the second conductive layer 186.

The second contact layer 184 may comprise a material selected from a group consisting of TiN, TiAlN, TaN, TaAlN, and TaC, or combinations thereof, while the second conductive layer 186 may comprises a material selected from a group consisting of W, Al, Cu and TiAl, or combinations thereof.

The dummy gates 104, the material layer 140 and the dielectric layer 180 all may be formed by means of Plasma Enhanced Atomic Layer Deposition (PEALD), Chemical Vapor Deposition (CVD), Physical Vapor Deposition (PVD), Pulse Laser Deposition (PLD), Atomic Layer Deposition (ALD), or any other appropriate processes.

The dummy gates 104, the material layer 140 and the dielectric layer 180 may all comprise a material selected from a group consisting of $SiO_2$ (USG), doped $SiO_2$ (e.g. fluorosilicic glass, boron silicate glass, phosphor silicate glass, or boron phosphor silicate glass), and a low-k dielectric material (e.g. black diamond, coral, etc.), or combinations thereof. The dummy gate 104, the material layer 140 and the dielectric layer 180 all may be in a multi-layer structure. The material of the dielectric layer 180 may be same as or different from that of the dummy gate 104. The planarization operation may be performed by means of Chemical Mechanical Polish (CMP).

In the present invention, when applying a replacement gate process, the material layer is made with a material same as that of the dummy gates, such that the material layer may be removed when removing the dummy gate so as to form recesses. Next, the recesses are filled with a conductive material which then is planarized to expose the sidewall spacers and to form gate stack structures and first contacts. All these are favorable for making use of limited spacing and filling the space within the spacing completely with a conductive material to form contacts. Namely, the contacts may be formed in a self-aligned manner, which is favorable for extending process windows in forming contacts. Additionally, removing the dummy gates and the material layer at the meantime is favorable for simplifying the process and reducing damages to the semiconductor substrate arising from the removing operation.

Figure 14:
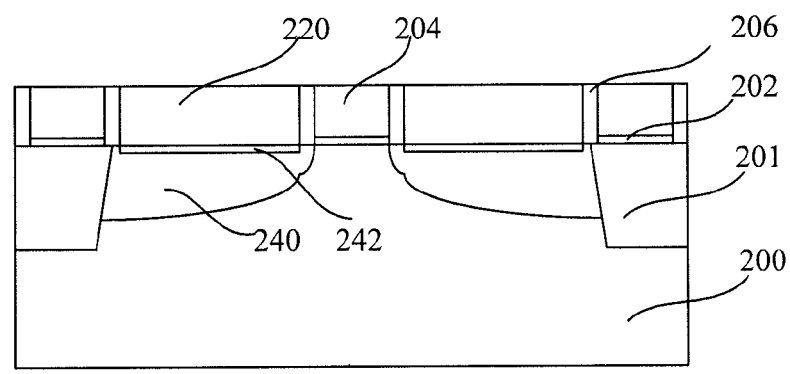
FIG. 14 is a structural diagram of a semiconductor device according to an embodiment of the present invention.

As shown in FIG. 14, according to an embodiment of the present invention, it is further provided a semiconductor device which is formed on a semiconductor substrate 200. The semiconductor device comprises first contacts 220 and at least two gate stack structures which are formed on active regions (on which source/drain regions 240 and a metal silicide layer 242 are formed, wherein the metal silicide layer 242 is formed from reaction of the surface of the source/drain regions 240 with the metal) and isolation regions 201 respectively. Each of the gate stack structures comprises a metal gate 204. The first contacts are sandwiched between the gate stack structures, and the material of the first contacts 220 is the same as the material of the metal gates 204.

Each of the gate stack structures comprises a gate dielectric layer 202, a metal gate 204 and sidewall spacers 206. The metal gates 204 are formed on the semiconductor substrate 200 with the gate dielectric layer 202 therebetween. The sidewall spacers 206 surround their respective metal gates 204 and the gate dielectric layer 202, or the sidewall spacers 206 are formed on the gate dielectric layer 202 and surround their respective metal gates 204. Herein, except the numbers, the gate stack structures are same as those described in the foregoing text and thus are not described here for conciseness's sake.

In an embodiment, the first contacts 220 may comprise a first contact layer and a first conductive layer. The first conductive layer is formed on the first contact layer. The first contact layer may comprise a material selected from a group consisting of TiN and TiAlN, or combinations thereof and the first conductive layer may comprise a material selected from a group consisting of W, Al, and TiAl, or combinations thereof, or a combination of Cu with W, Al or TiAl.

Additionally, the semiconductor device further comprises second contacts which comprise a second contact layer and a second conductive layer. The second conductive layer is formed on the first contacts with the second contact layer therebetween. The second contact layer may comprise a material selected from a group consisting of TiN, TiAlN, TaN, TaAlN, and TaC, or combinations thereof and the second conductive layer may comprises a material selected from a group consisting of W, Al, Cu, and TiAl, or combinations thereof.

The present invention further provides another method for forming a semiconductor device, comprising the following steps.

Figure 15:
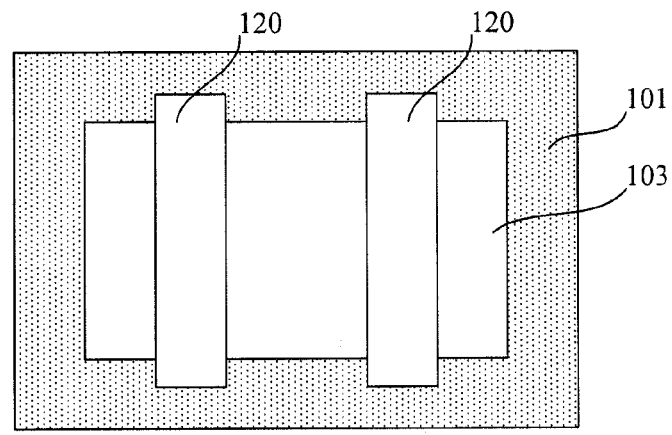
FIGS. 15 to 19 illustrate cross-sectional views of respective intermediate structures obtained during another method for forming a semiconductor device according to another embodiment of the present invention.

First, as shown in FIG. 15, at least two gate stacks are formed on a semiconductor substrate, wherein the gate stacks are formed on an active region 103 and an isolation region 101, and each of the gate stacks comprises a gate dielectric layer 122 and a dummy gate 120, wherein the dummy gate 120 is formed on the semiconductor substrate with the gate dielectric layer 122 therebetween.

Figure 16:
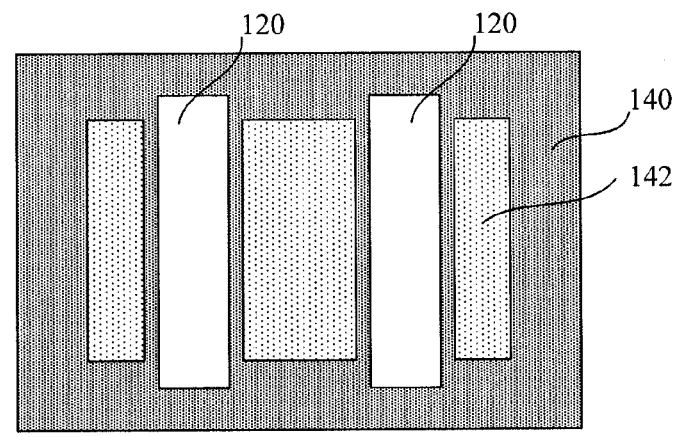

Next, as shown in FIG. 16, a mask layer 140 is formed which surrounds the gate stacks and exposes at least a portion of the active region 103 (the active region outside the gate stacks is exposed completely in the present embodiment, while the active region may be exposed partially in other embodiments), so as to form contact regions 142.

Figure 17:
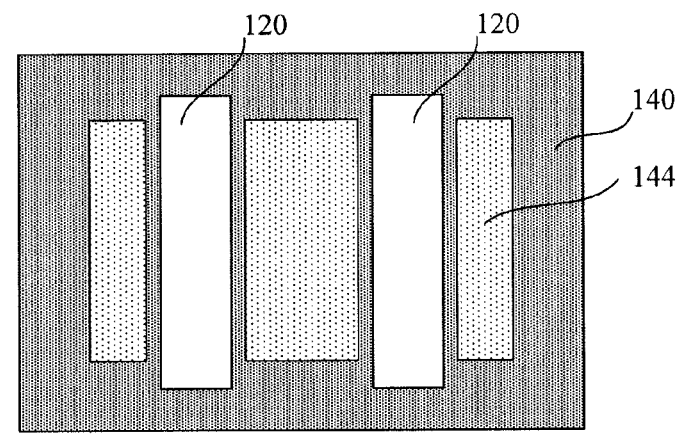

Next, as shown in FIG. 17, a material layer 144 is formed which fills the contact region 142 and exposes the top surfaces of the dummy gate 120 and the mask layer 144, wherein the material of the material layer 144 is the same as the material of the dummy gate 120.

Figure 18:
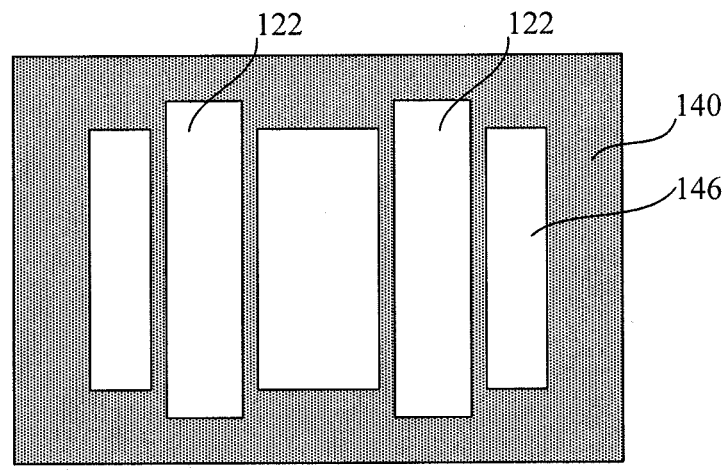

Then, as shown in FIG. 18, the dummy gates 120 (exposing the gate dielectric layer 122) and the material layer 144 are removed, so as to form recesses 146.

Figure 19:
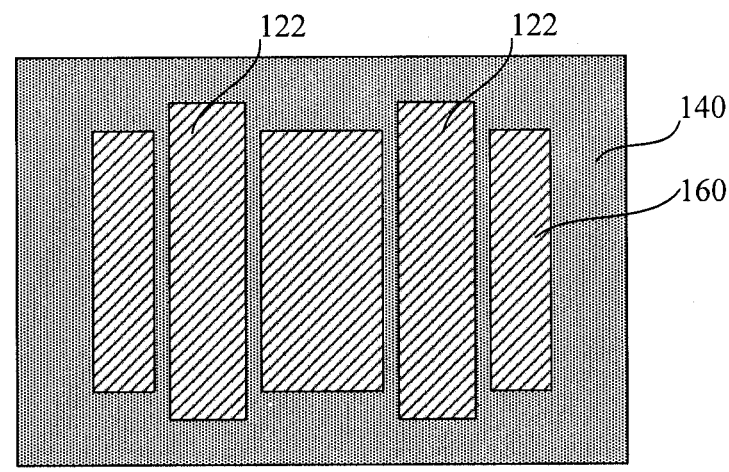

Finally, as shown in FIG. 19, the recesses 146 are filled with a conductive material 160, and the conductive material 160 are planarized to expose the top surfaces of the mask layer 140, whereby gate stack structures and first contacts are formed.

The mask layer 140 may be any insulating material, for example, a material selected from a group consisting of $Si_3N_4$, $SiO_2$, $Si_2N_2O$, SiC, and SiCN, or combinations thereof (e.g. may be in a multi-layer structure). The mask layer 140 may be formed by means of deposition-etching process.

The material of the material layer and the material of the dummy gate may be doped or undoped polysilicon or amorphous silicon.

The step for filling the recesses may comprise: forming a first contact layer which covers bottoms and sidewalls of the recesses and forming a first conductive layer which covers the first contact layer.

If the first contact layer comprises a material selected from a group consisting of TiN and TiAlN, or combinations thereof, the first conductive layer may comprises a material selected from a group consisting of W, Al and TiAl, or combinations thereof, or comprise a combination of Cu with W, Al or TiAl.

The method further comprises the following steps.

First, a planarized dielectric layer is formed which covers the gate stack structure and the first contacts. Next, contact vias are formed in the planarized dielectric layer, wherein the contact vias expose partially the first contacts. Next, a second contact layer is formed which covers the bottoms and sidewalls of the contact vias. At last, a second conductive layer may be formed which covers the second contact layer and fills the contact vias, so as to form second contacts.

The second contact layer may comprise a material selected from a group consisting of TiN, TiAlN, TaN, TaAlN, and TaC, or combinations thereof, and the second conductive layer may comprises a material selected from a group consisting of W, Al, Cu and TiAl, or combinations thereof.

The composition and formation method of other related materials are the same as those described in the foregoing text and thus are not described here for conciseness's sake.

In addition, the scope to which the present invention is applied is not limited to the process, structure, manufacture, material composition, means, methods and steps described in the specific embodiments in the specification. A person of ordinary skill in the art should readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention without departing from the protection scope of the present invention.

What is claimed is:

1. A method for forming a semiconductor device, comprising:
    forming at least two gate stacks and respective sidewall spacers on a semiconductor substrate, wherein all of the gate stacks are formed on active regions and isolation regions, each of the gate stacks comprises a gate dielectric layer and a dummy gate, the dummy gate is formed on the semiconductor substrate, and the gate dielectric layer is sandwiched between the dummy gates and the semiconductor substrate, wherein the sidewall spacers surround both of the respective dummy gate and the respective gate dielectric layer, or the sidewall spacers are formed on the respective gate dielectric layer and surround the respective dummy gate;
    forming a material layer, which exposes the dummy gates and the sidewall spacers and fills spaces between two adjacent ones of the gate stacks, wherein the material of the material layer is the same as the material of the dummy gate;
    removing the dummy gates and the material layer at the same time to form recesses;
    filling the recesses with a conductive material, and planarizing the conductive material to expose the sidewall spacers; and
    breaking the conductive material outside the sidewall spacers to form at least two conductors, each of the conductors being only in contact with the active region at one side outside one of the sidewall spacers, so as to form gate stack structures and first contacts at the same time.

2. The method according to claim 1, wherein the material of the material layer and the material of the dummy gate comprises polysilicon or amorphous silicon which are doped or undoped.

3. The method according to claim 2, wherein the step for filling the recesses comprises:
    forming a first contact layer which covers the bottom and sidewalls of the recesses; and
    forming a first conductive layer which covers the first contact layer.

4. The method according to claim 3, wherein when the first contact layer comprises at least one material selected from the group consisting of TiN and TiAlN, the first conductive layer comprises at least one material selected from the group consisting of W, Al, and TiAl, and a combination of Cu with W, Al or TiAl.

5. The method according to claim 1, further comprising:
    forming a planarized dielectric layer which covers the gate stack structures and the first contacts;
    forming contact vias in the planarized dielectric layer, wherein the contact vias expose a portion of the first contacts;
    forming a second contact layer which covers the bottom and sidewalls of the contact vias;
    forming a second conductive layer which covers the second contact layer and fills the contact vias to form second contacts.

6. The method according to claim 5, wherein the second contact layer comprises at least one material selected from the group consisting of TiN, TiAlN, TaN, TaAlN, and TaC, and the second conductive layer comprises at least one material selected from the group consisting of W, Al, Cu, and TiAl.

7. A method for forming a semiconductor device, comprising:
    forming at least two gate stacks on a semiconductor substrate, wherein all of the gate stacks are formed on active regions and isolation regions, each of the gate stacks comprises a gate dielectric layer and a dummy gate, the dummy gate is formed on the semiconductor substrate, and the gate dielectric layer is sandwiched between the dummy gates and the semiconductor substrate;

forming a mask layer which surrounds the gate stacks and exposes at least a portion of the active region to form a contact region;

forming a material layer which fills the contact region and exposes the dummy gates and the mask layer, wherein the material of the material layer is the same as the material of the dummy gates;

removing the dummy gates and the material layer at the same time to form recesses; and filling the recesses with a conductive material, and planarizing the conductive material to expose the mask layer and to form gate stack structures and a first contact at the same time.

8. The method according to claim 7, wherein the material of the material layer and the material of the dummy gate is polysilicon or amorphous silicon which are doped or undoped.

9. The method according to claim 8, wherein the step for filling the recess comprises:

forming a first contact layer which covers the bottom and the sidewalls of the recess; and forming a first conductive layer which covers the first contact layer.

10. The method according to claim 9, wherein the first contact layer comprises at least one material selected from the group consisting of TiN and TiAlN, the first conductive layer comprises at least one material selected from the group consisting of W, Al, and TiAl, and a combination of Cu with W, Al or TiAl.

11. The method according to claim 7, further comprising:

forming a planarized dielectric layer which covers the gate stack structure and the first contact;

forming a contact via in the planarized dielectric layer, wherein the contact via exposes a portion of the first contact;

forming a second contact layer which covers the bottoms and sidewalls of the contact via; and forming a second conductive layer which covers the second contact layer and fills the contact via to form a second contact.

12. The method according to claim 11, wherein the second contact layer comprises at least one material selected from the group consisting of TiN, TiAlN, TaN, TaAlN, and TaC, and the second conductive layer comprises at least one material selected from the group consisting of W, Al, Cu, and TiAl.

* * * * *